United States Patent [19]

Wegmann et al.

[11] Patent Number: 4,622,121
[45] Date of Patent: Nov. 11, 1986

[54] APPARATUS FOR COATING MATERIALS BY CATHODE SPUTTERING

[75] Inventors: Urs Wegmann, Oberschan, Switzerland; Eduard Rille, Dornbirn, Austria

[73] Assignee: Balzers Aktiengesellschaft, Liechtenstein, Liechtenstein

[21] Appl. No.: 725,016

[22] Filed: Apr. 18, 1985

[30] Foreign Application Priority Data

Apr. 19, 1984 [CH] Switzerland .......................... 1970/84

[51] Int. Cl.$^4$ ............................................ C23C 14/34
[52] U.S. Cl. .................................................. 204/298
[58] Field of Search ............................ 204/298, 192 R

[56] References Cited

U.S. PATENT DOCUMENTS

| 4,385,979 | 5/1983 | Pierce et al. | 204/298 |
| 4,414,086 | 11/1983 | Lamont, Jr. | 204/298 X |
| 4,434,038 | 2/1984 | Morrison, Jr. | 204/298 X |
| 4,444,635 | 4/1984 | Kobayashi et al. | 204/298 X |
| 4,465,575 | 8/1984 | Love et al. | 204/298 X |
| 4,498,969 | 2/1985 | Ramachadran | 204/298 |

Primary Examiner—John F. Niebling
Assistant Examiner—Nam X. Nguyen
Attorney, Agent, or Firm—McGlew and Tuttle

[57] ABSTRACT

Arrangements for coating substrates, comprising a hollow cathode around the substrate with at least two sputtering zones with the proportion between the sputtering performances in the zone being adjustable, to obtain a more uniform coating also of lateral surfaces formed by steps on the substrate.

13 Claims, 2 Drawing Figures

4,622,121

APPARATUS FOR COATING MATERIALS BY CATHODE SPUTTERING

FIELD AND BACKGROUND OF THE INVENTION

This invention relates in general to cathode sputtering devices and in particular to a new and useful apparatus for coating materials includes a cathode of generally cylindrical shape having an opened end with a holder for the material to be sputtered positioned in the opened end and including a magnet system disposed so as to influence the formation of at least two sputtering zones which may be proportionally adjusted.

The present invention relates to cathode sputtering, particularly such intended for utilizing semiconductor discs. Semiconductor discs employed for this purpose undergo a preliminary treatment in which a geometric surface structure with recesses for electrical connections is produced in an insulating layer on their surface in photolighographic processes. While the disc has typically a diameter between 50 mm and 200 mm and a thickness of some 10ths of a millimeter, the recesses have a width of mostly only a few micrometers (microns) and a depth corresponding to about the thickness of the insulating layer. A subsequent application of a metal layer (thickness of about 1 micrometer) provides contact to the discs through the recesses and still other structures are etched in the metal layer during the subsequent operations. Suitable materials for the metal layer are aluminum, aluminum alloys, titanium-tungsten alloys, etc. With cathode sputtering apparatus normally employed for metallization, namely such comprising a planar magnetron, the following arrangements are distinguished:

1. Drum-Type Apparatus:

A plurality of substrate discs is secured to the outer surface of a drum having a polygonal section. At the side of the drum, at least one sputtering magnetron is provided representing, in its region opposing the substrate disc, a substantially linear source of material including two straight line sources which are arcuately connected to each other at their ends. The erosion zone of such sources thus forms a closed path. With the drum uniformly turning about its axis, the substrate discs are uniformly coated, in the axial direction due to the line source and in the peripheral direction due to the uniform rotation. The spacing between the substrate in coating position and the parallel magnetron can be varied within certain limits, without thereby exceeding the permissible tolerances for the uniformity of the layer thickness.

2. Dish-Type Apparatus:

In this arrangement, a plurality of substrate discs is placed on a large circular rotary dish. At least one magnetron is provided thereabove. The erosion zone of this magnetron in the region opposite to the substrate discs should be shaped to coat the substrates uniformly during a uniform rotation of the dish. In this prior art arrangement again, the spacing between the substrates and the planar magnetron can be varied within certain limits without thereby exceeding the tolerances of the uniformity of the layer thickness.

3. Single-Disc Apparatus

In this apparatus, a single round substrate disc is placed in fixed position opposite a planar magnetron having is erosion zone in the form of a ring. A certain relation between the substrate disc diameter, the diameter of the erosion zone circle, and the spacing of the substrate from the magnetron must be maintained in this instance, to meet distribution tolerances of ±5% or less. With a too small spacing, the substrate would become coated in an annular zone opposite to the erosion zone with a thicker layer than at the center. With a large spacing, on the contrary, the coating of the substrate would become thickest at the center, and thoroughly taper out to the circumference.

Aside from the uniformity of the layer thickness, a best possible satisfactory coating of any steps of the substrate surfaces to be coated, such as at the edges of the mentioned recesses for electrical contacting, should be obtained in any case, with regard to both the local distribution of the substrates and to the orientation of the edges. The coating attainable with prior art arrangements of surfaces extending perpendicularly to a substrate surface, the so called "step coating" (indicated usually in percent of the layer thickness at a certain distance from the step) and uniformity thereof, have frequently been unsatisfactory. An unsatisfactory step coating is often obtained in a single-disc apparatus close to the edge of the substrate disc on the step surface facing the outside. But in drum and dish type apparatus also, the value of step coating of vertical steps hardly exceeds 50%. This is caused by the directional distribution of the sputtered cathode material. This distribution follows Lambert's cosine emmision law, i.e. its maximum intensity perpendicular to the plane of the cathode. Basically, this does not change if an erosion trench is formed during the material removal from the sputtered surface of the magnetron.

Occasionally, a modification of the planar magnetron with a plasma ring on a conical cathode surface has been used for single-disc apparatus. An obliquely inwardly directed material stream is thereby obtained. The step coating on the substrate discs, however, is only insignificantly improved with this prior art measure.

SUMMARY OF THE INVENTION

The present invention is directed to an arrangement for coating substrates permitting an improved step coating while well preserving the satisfactory uniformity of the layer thickness.

In accordance with the invention, an apparatus for coating a material such as a substrate by cathode sputtering comprises an anode with a cathode in the form of a hollow body having an opening and disposed with its opened end adjacent the anode. A holder for the material to be sputtered is positioned adjacent the opening in the cathode and a magnet system disposed around the cathode and provides an magnetic field which influences the formation of at least two sputtering zones on the cathode which may be controlled so as to vary the proportional sputtering performances of the zones.

In principle, a sputtering apparatus with a hollow cathode in the shape of a cup, for example, is known from Swiss patent No. 204,862 to Berghaus. A similar arrangement with a hemispherical concave cathode has been described in Research/Development (Feb. 1971, page 40). According to that arrangement, a quadrupole field was produced by means of two axial coils, thus an annular erosion zone was maintained on the cathode surface, while controlling the uniformity of coating of a flat substrate at the coating rate by the currents flowing through the two coils.

However, in spite of a cathode surface partly surrounding the substrates to be coated, these prior art arrangements were not quite suitable for coating substrates with steps (such as the above mentioned recesses in insulating layers on semiconductor discs, intended for establishing electrical connections), because the sputtering from different directions could not be adjusted to satisfy given conditions.

The inventive arrangement with two separate sputtering zones, making possible an adjustment of the performance of two sputtering forces independently of each other, represents an important advance over all prior art arrangements providing a single sputtering zone on a conical or hemispherical cathode surface. It is particularly advantageous if each of the two sputtering zones is dimensioned and located to furnish a uniform layer thickness distribution on a flat substrate surface all alone. The proportion of the sputtering performances of course may be optimized in view of the coating of the steps. Further, such an arrangement is particularly suitable for producing alloy coatings by simultaneously sputtering a first metal from the first zone, and a second metal from the second zone. The composition of the alloy may then be adjusted by adjusting as desired the proportion of the simultaneous sequential sputtering performances and/or the time intervals. The composition of the alloy on the steps of the substrate surfaces to be coated will then be substantially better than initially expected with regard to the position of the two sputtering zones relative to the lateral faces of the steps. This is due to the fact that the different areas of the cathode coat each other, so that the mixing takes place not only on the substrates but also already on the cathodes.

While using for inventive arrangements sputtering magnetrons known per se, a first sputtering zone may be formed by a magnetron having a planar cathode surface, and a second sputtering zone may be formed by a magnetron having a cylindrical cathode surface extending perpendicularly thereto. But the inventive idea may be carried out also with the conical cathode parts, as will be shown hereinafter.

Accordingly, it is an object of the invention to provide an improved sputtering device in which the material to be sputtered is positioned on a support which is an opened end of a cathode arranged alongside an anode and with a magnetic system providing an influence on two sputtering zones in the cathode.

A further object of the invention is to provide a sputtering device which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
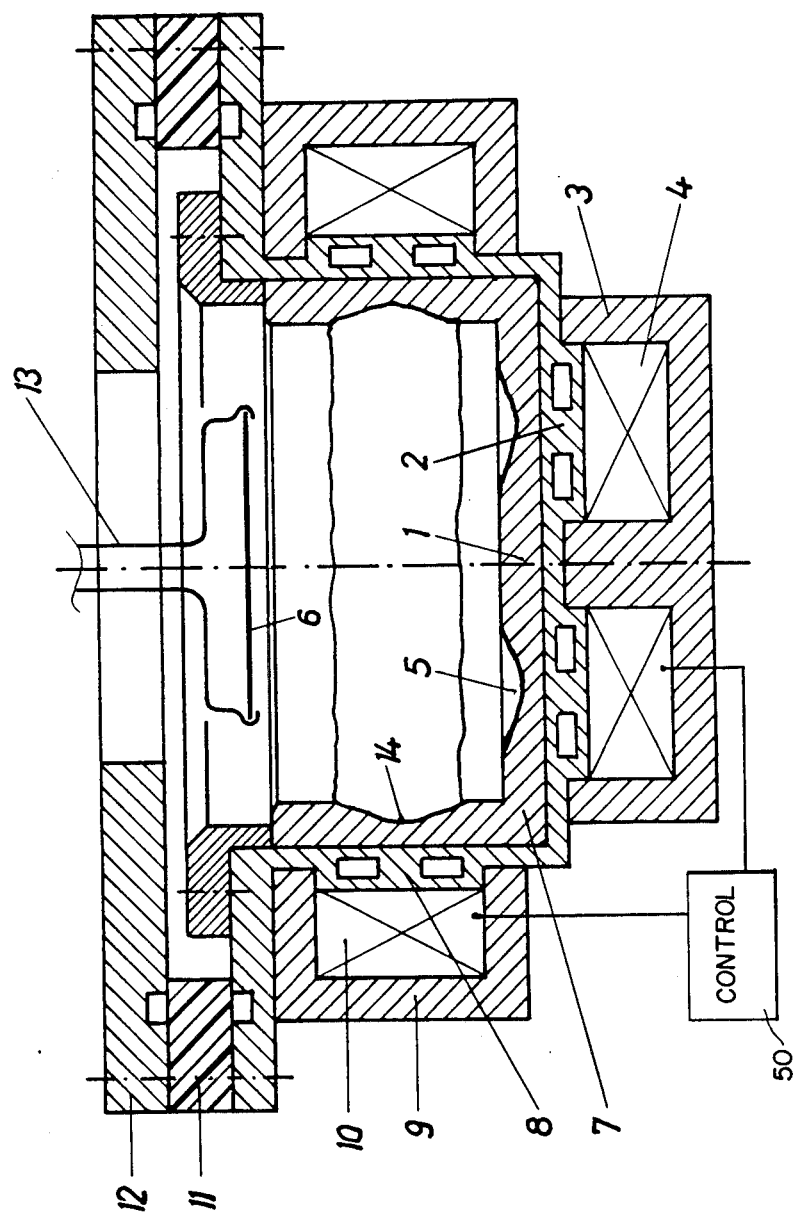
FIG. 1 is a sectional view of a first embodiment with a planar magnetron forming the bottom and an annular magnetron forming the side wall of a cup-shaped cathode constructed in accordance with the invention.

Referring to the drawings in particular the invention embodied therein comprises an apparatus for coating a material or substrate by cathode sputtering and which comprises the embodiment of FIG. 1 an anode 12 located adjacent the cathode 1, which in this invention comprises a cylindrical member having an open end into which a holder 13 having an annular substrate 6 is positioned. Means defining the cathode 1 may comprise a single cylindrical member or a plurality of members forming a cylinder closed at one end and opened at the other end.

In accordance with the invention, a magnet system is associated with the cathode and advantageously disposed around the cathode and provides a magnetic field defining or influencing the formation of at least two sputtering zones on the cathode 1 including a horizontal zone 5 and a vertical zone 14. The magnetic system in the embodiment of FIG. 1 comprises an iron yoke 9 and a coil 10 which extends around the side of the cathode 1 and a iron yoke 3 and a coil 4 which is located at the bottom of the cathode 1 on the exterior thereof in both instances. Control means 50 are connected to a coils 4 and 10 for the purpose of influencing these magnetic portions so as to adjust the proportion between the sputtering performances in the sputtering zones 5 and 14.

In the embodiment of FIG. 1, the cup-shaped cathode 1 of a planar magnetron is made of a coating material and connected to a cooling plate 2 which is provided with water passages. The cathode may be soldered, welded, or even only press-fitted to the cooling plate.

In the embodiment of FIG. 1, the magnetic system of the planar magnetron comprises an electromagnet with an iron yoke 3 and a coil 4 and has the configuration of a pot-shaped magnet. Similar magnetic systems with permanent magnets are also customary, however. As far as the cathode is made of a non-magnetic material, the lines of magnetic force extend therethrough so that an annulus of magnetic flux is formed passing through the free side of the cathode by which, in operation, electrons and ions are entrapped. The cathode is thus exposed in its erosion zone 5 of ion bombardment causing sputtering of the coating material.

In the present example, a circular substrate 6 is to be coated as a single disc. To obtain a maximum uniformity of the coating, the planar magnet forming the bottom of the cathode cavity, is also designed as a body of revolution and disposed in parallel to and concentrically of the substrate 6.

Insofar, the arrangement would correspond to the prior art. The spacing of the cathode 1 from substrate 6 and the diameter of an erosion and sputtering zone 5 are selected to obtain an as uniform distribution of the layer thickness as possible.

In accordance with the invention, a second magnetron is provided in addition, comprising a hollow cylindrical cathode 7 made of the coating material, a cooling cylinder 8, an iron yoke 9 and a coil 10. As may be learned from the drawing, the cathode surface of this second magnetron extends perpendicularly to the cathode surface of the planar first magnetron and forms therewith a cavity which is open toward the substrate. In this example, the two systems are connected to a single hollow body of a cathode, forming, together with the anode 12, and an insulator ring 11, a unit into which the substrates 6 to be coated are introduced in the axial direction by means of a holder 13.

To effect the sputtering, voltage must be applied to the anode and cathode. Particularly simple is the use of a single supply unit, thus application of the same operating potential to both of the magnetrons. An electrical insulation discussed in the next example, between the cathodes of the two magnetrons can thus be omitted. The power proportion for sputtering in the two erosion and sputtering zones 5 and 14 is adjusted by correspondingly selecting the currents in coils 4 and 10, to the effect of obtaining a satisfactory uniform coating of the substrate and also of any steps provided thereon. In arrangements in accordance with the invention, both of the sputtering zones can selectively be operated with dc or ac voltage. The advantages of the invention are obtained in both instances. In addition, in a manner known per se, dc or ac voltage may be applied to the substrate, to control the effect produced on the substrate surface by the plasma.

Figure 2:
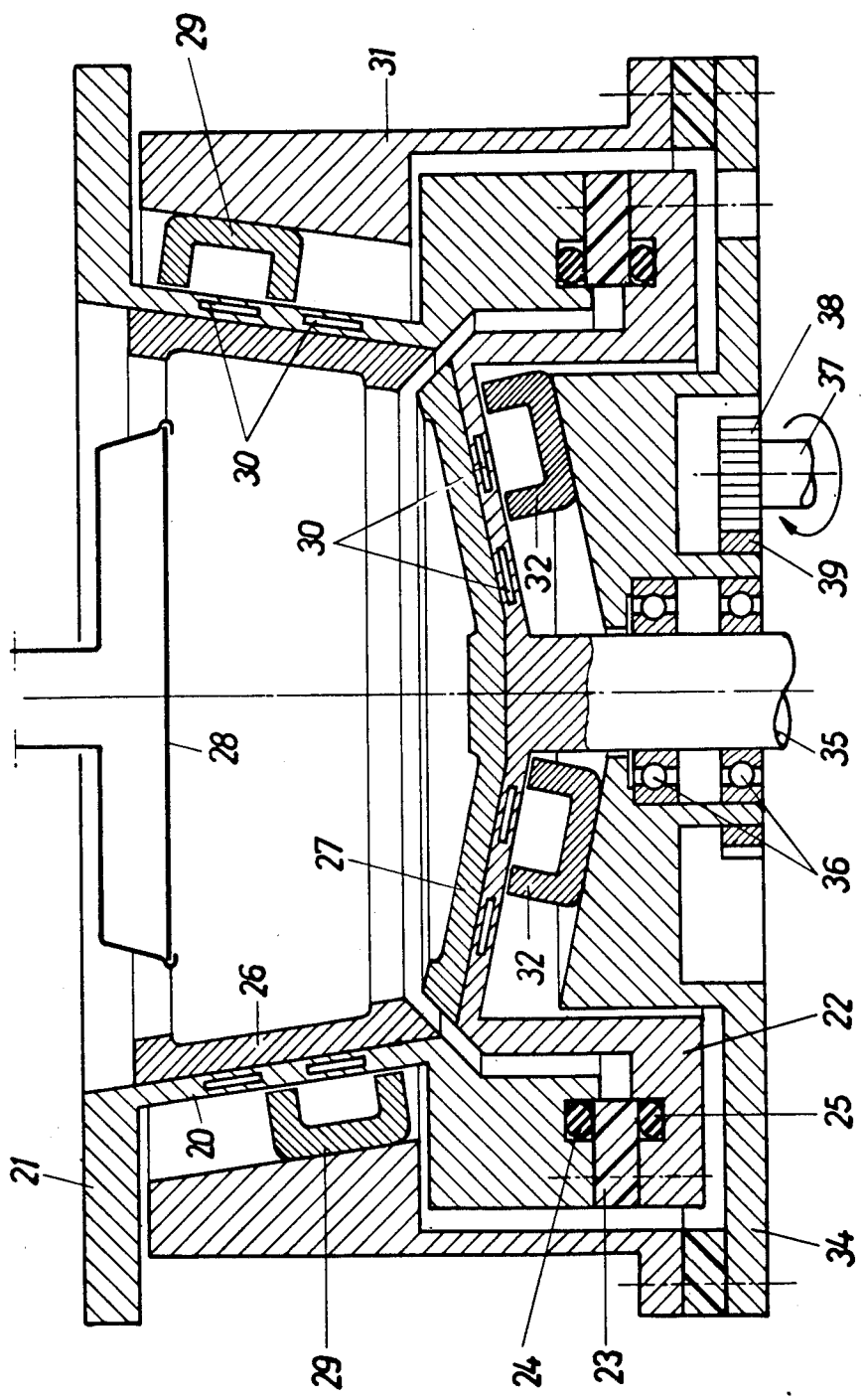
FIG. 2 shows a second embodiment in which two conical cathode parts form together a cathode cavity.

Another advance can be obtained by moving the magnetic fields, and thus the sputtering zones, relative to each other. Advantageously, as indicated in FIG. 2, the magnets only are moved, not the cathodes. This not only improves the utilization factor of the cathodes but also results in a uniform removal of the material, since the material is sputtered from place to place within the different cathode areas.

FIG. 2 shows an upper having part 20 provided with a flange 21 of a vacuum tight housing which may be flanged to another vacuum chamber, or a vacuum pump stand, for example. At its underside, housing part 20 is vacuum-tightly joined to a bottom part 22 by means of an insulating ring 23 and two seal rings 24,25. The inside of the housing turned to the vacuum space is lined with cathode parts 26 and 27 of the material to be sputtered. Parts 26,27 again form a cup-like structure open toward the substrate 28 to be coated. At the outer circumference of housing part 20, a first annular magnetic system 29 is provided in oblique position and secured to an outer shell 31 which is mounted for rotation. This first magnetic system produces in the interior of the sputtering chamber, in the zone of cathode 26, a magnetic field which, in a manner known per se, concentrates the sputtering to a first sputtering zone if a corresponding voltage is applied between the cathode and the substrates.

In a similar way, a second magnetic system 32 in eccentric position is provided below and outside bottom part 22, which is supported by the bottom 34. Bottom 34 is connected to rotary outer shell 31 and thus taken along in rotation. This second magnetic system produces the needed magnet field in the interior of the sputtering space above cathode 27, in a second sputtering zone.

The two magnetic systems are advantageously so polarized that they repel each other. The oblique position, i.e. the angle between the axes of the magnetic systems and the axis of the hollow cathode body, as well as the eccentricity of the two magnetic systems, are best provided such as to obtain that during their rotation, the systems keep being spaced from each other by a predetermined distance.

As further shown in FIG. 2, the bottom part 22 of the housing is supported on a fixed column 35 to which ball bearings 36 permitting rotation of bottom 34 and shell 31 are secured. Bottom 34 and shell 31 are driven from a shaft 37 through a gear 38 meshing with a gear rim 39.

Since, as shown in FIG. 2, magnetic system 29 cooperating with cathode 26 is disposed obliquely that is at a non-perpendicular angle to the axis so that the magnetic system 32 cooperates with cathode 27 is positioned asymmetrically relative thereto, the rotary motion periodically displaces the magnetic field relative to the fixed cathode surfaces.

The material is thereby removed from the different areas more uniformly. In this connection, it is frequently advantageous to synchronize the tool movements with each other in a way such as to obtain a best utilization of the cathode material.

Still another method of adjusting the proportion of sputtering performances in the two sputtering zones produced by the magnetron systems will now be explained again with reference to FIG. 2. This method requires two separate voltage supply units by means of which the cathode parts insulated from each other are brought to different potentials, to separately control the sputtering in the two zones.

Only two cathode parts are considered in the above examples, between which the proportion of sputtering performances is adjustable. It will be understood, however, that by applying the inventive idea, a plurality of sputtering zones may be provided, or a plurality of cathode parts. In such an instance, it may be advantageous to provide a separate control of the sputtering in the individual zones, to meet most various coating conditions which may occur. The devices for controlling the sputtering performance in a specific zone may be conventional and they may also be designed for keeping the performance constant in two or more zones at the same time. It may further be advisable to operate the individual sputtering zones alternately and to control the performances averaged in time through the duration of the periods of switch-on state. Such control devices have been described in the literature already many times and they do not belong to the subject matter. If more than two sputtering zones in accordance with the invention are provided, however, the performance proportion of at least two sputtering zones must be adjustable.

While specific embodiments of the invention have been shown and described in detail to illustrate the application of the principles of the invention, it will be understood that the invention may be embodied otherwise without departing from such principles.

What is claimed is:

1. An apparatus for coating a material by cathode sputtering, comprising an anode, means defining a cathode in the form of a hollow cylindrical body having a cathode side wall which is open at one end and a closed end at its opposite end, said cathode being disposed adjacent to said anode, a material holder positioned adjacent said open end of said cathode, a first magnet system disposed around said cathode side wall for providing a first magnetic field influencing the formation of one sputtering zone on said cathode side wall, a second magnet system disposed adjacent said closed end for providing a second magnetic field influencing the formation of another sputtering zone on said closed end, and control means associated with said magnet systems for adjusting the proportion between said magnetic fields and thus between the sputtering performances in the sputtering zones.

2. An apparatus according to claim 1, wherein said means defining said cathode is of general cylindrical configuration with said side wall flaring outwardly toward said open end.

3. An apparatus according to claim 2, wherein said control means is connected to said magnetic systems and comprises means for shifting said magnetic fields relative to said cathode.

4. Apparatus according to claim 2, wherein said first magnet system comprises a coil and yoke disposed around said side wall, said one sputtering zone being formed on an inner surface of said side wall opposite from said first magnet system, said closed end having an inner surface facing said material holder and an outer surface facing away from said material holder, said second magnet system comprising a coil and yoke disposed at said outer surface of said closed end, said inner surface of said closed end forming said another sputtering zone.

5. An apparatus according to claim 4, wherein said cylindrical configuration has a central axis, at least one of said magnet systems being mounted for rotation about said axis.

6. An apparatus according to claim 5, wherein at least one of said coils of said magnet systems is eccentrically disposed around said axis.

7. An apparatus according to claim 6, wherein said first and second magnet systems are connected together so that both said magnet systems rotate about said axis, said coil of said second magnet system extending eccentrically around said axis and said coil of said first magnet system lying in a plane which is at a non-perpendicular angle to said axis.

8. An apparatus according to claim 1, wherein said means defining said cathode comprise a unitary open hollow cylinder, said side wall being cylindrical and being made as one piece with said closed end of said cathode, said side wall having an inner cylindrical surface forming said one sputtering zone on said cathode, said closed bottom having a surface opposite from said second magnet system and facing said material holder forming said another sputtering zone.

9. An apparatus according to claim 1, wherein said first magnet system is adjacent the side wall of said cathode and said second magnet system is adjacent the closed end of said cathode, said magnet systems repelling each other.

10. An apparatus according to claim 1, wherein said magnet systems each comprise a magnet associated with said side wall and said closed end of said cathode, and means for shifting said magnet relative thereto.

11. An arrangement according to claim 10, wherein said means defining a cathode comprises a rotatable member having a flange portion forming the closed end of said cathode and a separate annular side member disposed above an outer end of said flange portion defining said side wall, a housing surrounding said cathode including an inner portion and an outer portion and means for rotating said inner portion relative to said outer portion.

12. An arrangement according to claim 11, wherein said magnets are mounted on said inner portion of said housing for rotation.

13. An arrangement according to claim 12, wherein each magnet system includes a coil and a yoke, said inner portion of said housing being rotatable about an axis, said coil of said second magnet system being eccentric with respect to said axis and said coil of said magnet system lying in a plane which is oblique to said axis.

* * * * *